United States Patent
Wong et al.

[11] Patent Number: 6,028,444
[45] Date of Patent: Feb. 22, 2000

[54] THREE-STATABLE NET DRIVER FOR ANTIFUSE FIELD PROGRAMMABLE GATE ARRAY

[75] Inventors: Richard J. Wong, Saratoga; Paige A. Kolze, Mountain View, both of Calif.

[73] Assignee: QuickLogic Corporation, Sunnyvale, Calif.

[21] Appl. No.: 08/771,471

[22] Filed: Dec. 20, 1996

Related U.S. Application Data

[63] Continuation-in-part of application No. 08/667,702, Jun. 21, 1996.

[51] Int. Cl.$^7$ .................................................. H03K 19/173
[52] U.S. Cl. ................................ 326/38; 326/83; 326/103
[58] Field of Search ................................ 326/38–41, 44, 326/49, 83, 86, 102, 103, 45, 50, 87; 327/525

[56] References Cited

U.S. PATENT DOCUMENTS

| | | | |
|---|---|---|---|
| 4,439,804 | 3/1984 | Riddle et al. .............................. | 361/92 |
| 4,758,745 | 7/1988 | Elgamal et al. . | |
| 4,857,774 | 8/1989 | El-Ayat et al. . | |
| 4,910,417 | 3/1990 | El Gamal et al. . | |
| 5,010,258 | 4/1991 | Usami et al. ............................ | 307/469 |
| 5,053,909 | 10/1991 | Suzuki et al. ............................ | 326/102 |
| 5,055,718 | 10/1991 | Galbraith et al. . | |
| 5,083,083 | 1/1992 | El-Ayat et al. . | |
| 5,132,563 | 7/1992 | Fujii et al. ............................... | 326/103 |
| 5,194,759 | 3/1993 | El-Ayat et al. ......................... | 307/468 |
| 5,196,724 | 3/1993 | Gordon et al. .......................... | 257/530 |
| 5,208,530 | 5/1993 | El-Ayat et al. . | |
| 5,220,213 | 6/1993 | Chan et al. . | |
| 5,243,226 | 9/1993 | Chan . | |
| 5,302,546 | 4/1994 | Gordon et al. .......................... | 437/170 |
| 5,304,871 | 4/1994 | Dharmarajan et al. . | |
| 5,315,182 | 5/1994 | Sakashita et al. .................... | 307/482.1 |
| 5,327,024 | 7/1994 | Cox . | |
| 5,336,986 | 8/1994 | Allman . | |

(List continued on next page.)

OTHER PUBLICATIONS

Advanced Micro Devices, PAL Device Data Book and Design Guide, pp. 2–236 through 2–247 (1993).
Quicklogic Data Book, pp. 1–5 through 2–11 and 6–3 through 6–18, (1995).
Actel FPGA Data Book and Design Guide, pp. ix–xv, 1–5 through 1–34, 1–51 through 1–101, 1–153 through 1–222, 3–1 through 4–56 (1995).
C. Erickson, et al., "Logic Cell Array", The Programmable Gate Array Design Book, First Edition, pp. 1–9 thru 2–73 (1986).
S. Trimberger, "Field Programmable Gate Array Technology", pp. 1–14 and 98–170 (1994).
S. Brown et al., "Field Programmable Gate Arrays", pp. 1–43 and 88–202 (1992).
D. Pellerin and M. Holley, "Practical Design Using Programmable Logic" pp. 84–98 (1991).
Actel FPGA Data Book and Design Guide, pp. 3–1 through 3–94 and 4–1 through 4–56 (1995). No Month.
Xilinx, "The Programmable Logic Data Book," pp. 8–11 through 8–36 (1994). No Month.
Xilinx, "The Programmable Gate Array Design Book", First Edition, pp. 1–9 thru 2–73 (1986). No Month.

*Primary Examiner*—Michael Tokar
*Assistant Examiner*—Don Phu Le
*Attorney, Agent, or Firm*—Skjerven, Morrill, MacPherson, Franklin and Friel

[57] ABSTRACT

Internal net drivers of a field programmable gate array are laid out with additional transistors to increase current drive capability at low supply voltages when a low supply voltage mask option is used. When a high supply voltage mask option is used, the additional transistors are not used in this way and the net drivers do not provide additional switching current drive capability. In some embodiments, were a low supply voltage mask option net driver operated at the high supply voltage, an impermissibly large switching current would flow through a programmed antifuse in a net coupled to the output of the net driver.

28 Claims, 4 Drawing Sheets

U.S. PATENT DOCUMENTS

| | | | |
|---|---|---|---|
| 5,341,030 | 8/1994 | Galbraith | 326/38 |
| 5,347,519 | 9/1994 | Cooke et al. . | |
| 5,367,207 | 11/1994 | Goetting et al. . | |
| 5,391,942 | 2/1995 | El-Ayat et al. . | |
| 5,397,939 | 3/1995 | Gordon et al. . | |
| 5,416,367 | 5/1995 | Chan et al. | 326/44 |
| 5,424,655 | 6/1995 | Chua | 326/40 |
| 5,455,525 | 10/1995 | Ho et al. | 326/41 |
| 5,469,396 | 11/1995 | Eltoukhy . | |
| 5,477,167 | 12/1995 | Chua . | |
| 5,479,113 | 12/1995 | Gamal et al. . | |
| 5,495,181 | 2/1996 | Kolze | 326/38 |
| 5,498,979 | 3/1996 | Parlour et al. | 326/38 |
| 5,502,315 | 3/1996 | Chua et al. | 257/50 |
| 5,525,909 | 6/1996 | McCollum . | |
| 5,526,312 | 6/1996 | Eltoukhy . | |
| 5,528,600 | 6/1996 | El Ayat et al. . | |
| 5,534,793 | 7/1996 | Nasserbakht | 326/44 |
| 5,537,056 | 7/1996 | McCollum | 326/38 |
| 5,544,070 | 8/1996 | Cox et al. | 364/489 |
| 5,557,136 | 9/1996 | Gordon et al. | 257/530 |
| 5,572,476 | 11/1996 | Eltoukhy . | |
| 5,589,782 | 12/1996 | Sharpe-Geisler | 326/38 |
| 5,594,361 | 1/1997 | Campbell | 326/83 |
| 5,614,818 | 3/1997 | El Ayat et al. . | |
| 5,654,649 | 8/1997 | Chua | 326/16 |
| 5,712,578 | 1/1998 | Conley | 326/39 |
| 5,821,783 | 10/1998 | Torimaru et al. | 326/87 |

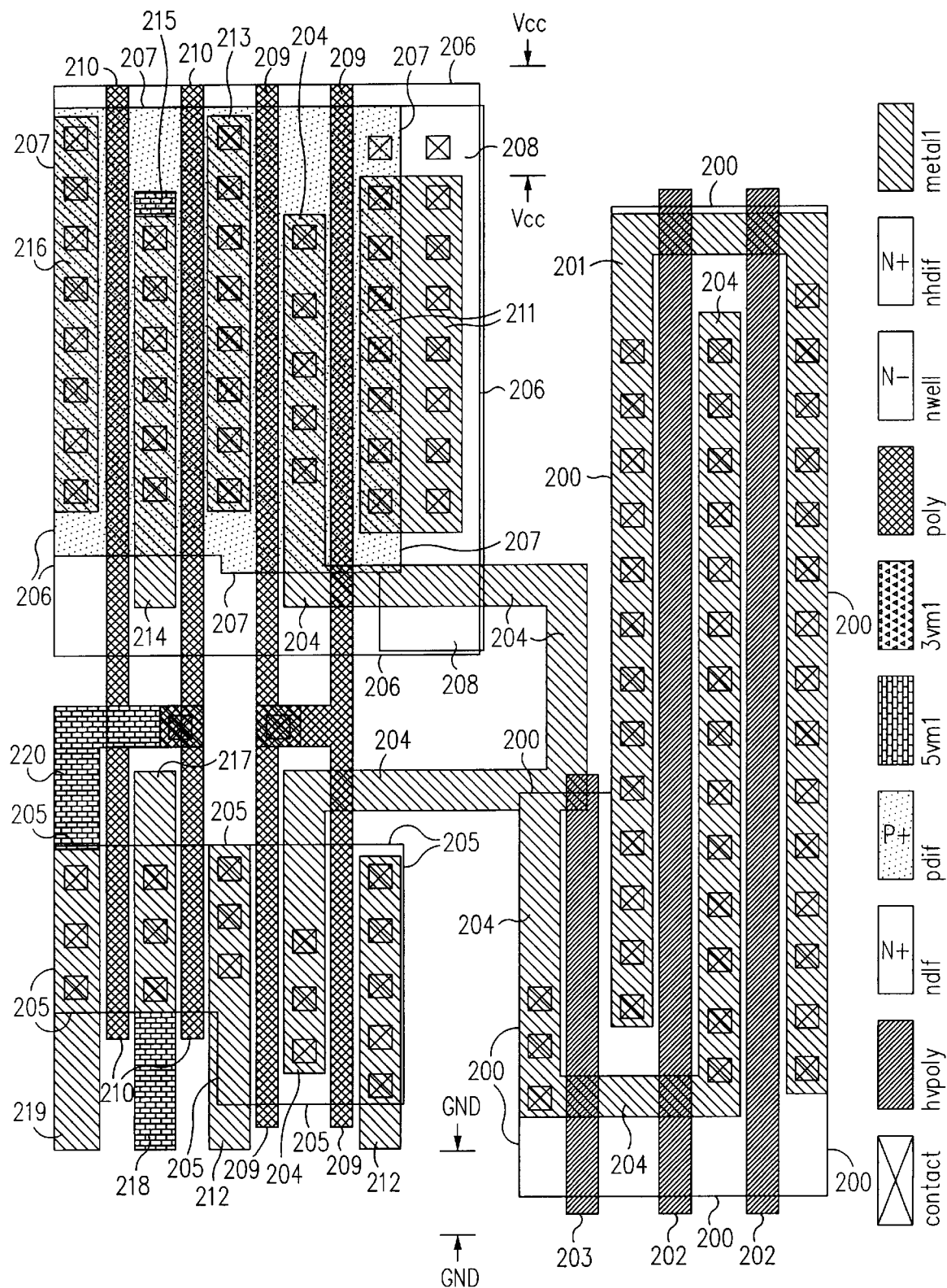
FIG. 5 (5.0 volt Mask Option)

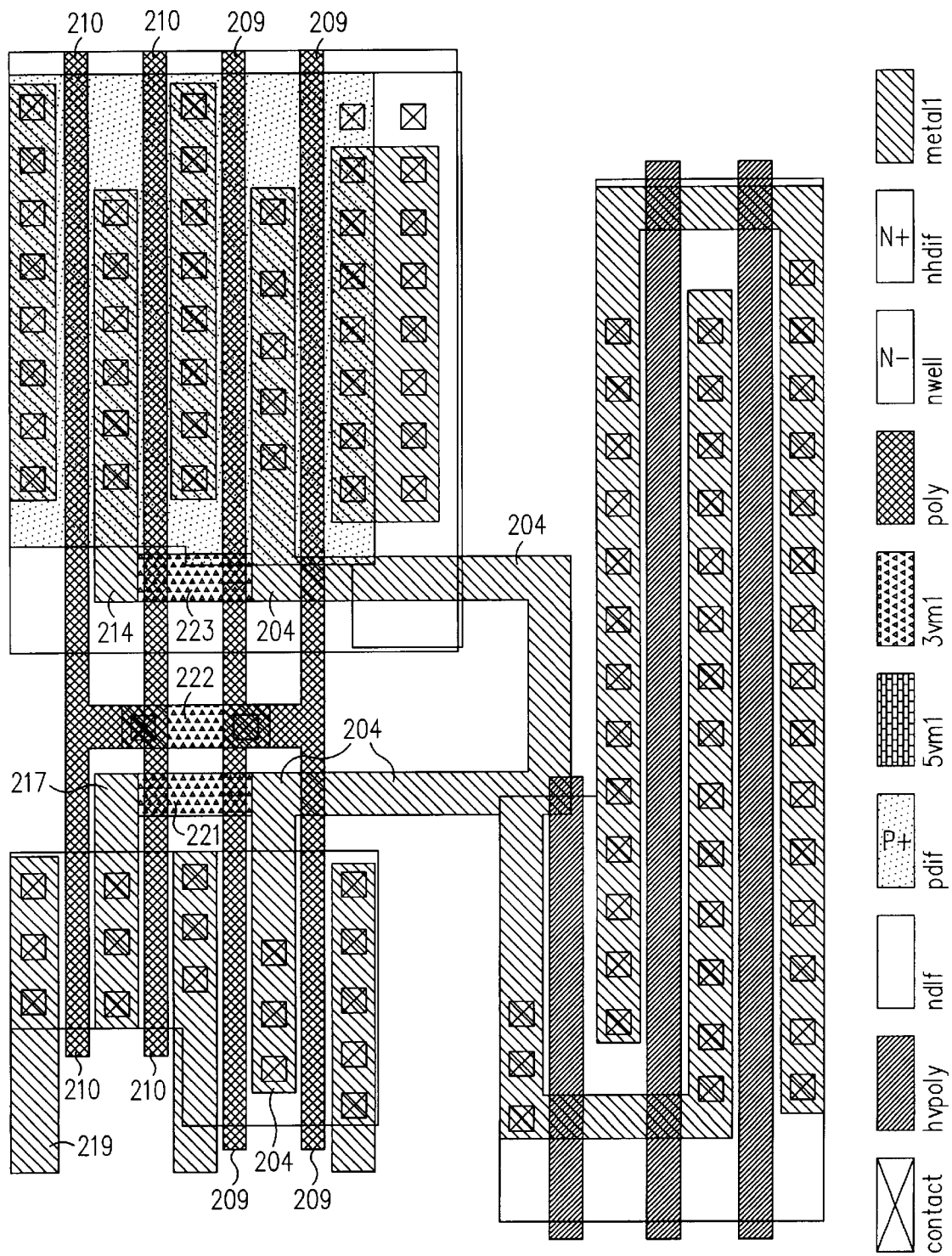
FIG. 7 (3.3 volt Mask Option)

THREE-STATABLE NET DRIVER FOR ANTIFUSE FIELD PROGRAMMABLE GATE ARRAY

CROSS-REFERENCE TO RELATED APPLICATION

This application is a continuation-in-part of Ser. No. 08/667,702, filed Jun. 21, 1996.

FIELD OF THE INVENTION

This invention relates to net drivers in programmable devices. More particularly, this invention relates to net drivers which drive nets having programmed antifuses in a field programmable gate array (FPGA).

BACKGROUND INFORMATION

FIG. 1 (Prior Art) is a simplified diagram of two logic modules 1 and 2 of a field programmable gate array (FPGA). An FPGA typically has numerous logic modules. Logic modules may be arranged in a two dimensional matrix having rows and columns with I/O modules surrounding the matrix at the periphery of the integrated circuit chip.

To realize a circuit desired by the user, selected logic in selected logic modules is connected to selected logic in other selected logic modules by programming the appropriate antifuses of a programmable interconnect structure. In FIG. 1, a portion of the programmable interconnect structure having horizontally extending routing conductors, vertically extending routing conductors, and antifuses is illustrated. Antifuses are illustrated with the symbol "X". Logic modules have net drivers 3–6 for driving logic signals out of the logic modules and onto the routing conductors of the interconnect structure. If, for example, it were desired to couple the output of net driver 3 of logic module 1 to the input 7 of logic module 2, then antifuses 8 and 9 would be programmed to couple horizontal routing conductor 10 to vertical routing conductor 11 and to couple vertical routing conductor 11 to horizontal routing conductor 12.

To program antifuse 8, for example, vertical routing conductor 11 may be coupled to ground potential (for example, 0 volts) and a programming voltage (for example, 12 volts) may be placed on horizontal routing conductor 10 such that a programming current flows through antifuse 8 to program antifuse 8 to form a permanent low impedance connection. For additional background information on field programmable gate arrays, logic modules, and antifuses, see: U.S. Pat. No. 5,416,367, U.S. Pat. No. 5,424,655, U.S. Pat. No. 5,196,724, U.S. Pat. No. 5,557,136, and U.S. Pat. No. 5,544,070 (the subject matter of these patents is incorporated herein by reference). To prevent high voltages from damaging the low voltage logic transistors of the net drivers 3–6 during antifuse programming, the net drivers of the logic modules are provided with protection transistors. During antifuse programming, these protection transistors are made nonconductive.

FIG. 2 (Prior Art) is a more detailed diagram of net driver 3. Net driver 3 involves a P-channel low voltage logic transistor 13, an N-channel low voltage logic transistor 14, a relatively large high voltage N-channel protection transistor 15 and a relatively small high voltage N-channel protection transistor 16. Transistors 13 and 14 form an inverter.

During normal operation of the circuit programmed into the FPGA, the output of the inverter is coupled to horizontal routing conductor 10 because protection transistors 15 and 16 are conductive due to the gate of protection transistor 15 being coupled to $V_{CC}$ (for example, 5.0 volts) and the gate of protection transistor 16 being coupled to a charge pump voltage $V_{CP}$ (for example, 7.8 volts). During antifuse programming, to isolate the output of the inverter from high voltages that could be present on horizontal routing conductor 10, protection transistors 15 and 16 are made nonconductive by coupling the gates of protection transistors 15 and 16 to ground potential (for example, 0 volts).

To achieve high operating speed of the user's circuit programmed into the FPGA, it is desired that net driver 3 be able to switch the digital logic level at input 7 as fast as possible. Due to the capacitive load of the routing conductors and programmed antifuses downstream of the programmed antifuses 8 and 9 and the capacitive load of input 7, it may be believed that the net driver should be fashioned to supply as large a current as possible during switching. When certain types of antifuses are used, however, this is not the case.

In some antifuse architectures, the electrical characteristics of a programmed antifuse may be altered if the peak operating current flowing through the antifuses during normal circuit operation exceeds a maximum permissible operating current. In certain amorphous silicon antifuses, for example, this value may be approximately 70 percent of the maximum DC programming current with which the antifuse was programmed. It is undesirable that the electrical characteristics of antifuses change during normal operation of the circuit programmed into the FPGA. Accordingly, there may be an upper limit on the peak operating current that can pass through a programmed antifuse in a net during switching and this maximum permissible operating current may depend on the programming current used to program the antifuse. The switching current sinking and sourcing capability of the net drivers 3–6 is therefore set close to this maximum permissible operating current to achieve the highest switching speeds possible with reliable operation.

FIG. 3 (Prior Art) is a graph illustrative of the drain-to-source current IDS of a field effect transistor versus drain-to-source voltage $V_{DS}$ for two gate-to-source voltages ($V_{GS}$=3.3 volts and $V_{GS}$=5.0 volts). As the gate-to-source voltage decreases, the drain-to-source current decreases. Accordingly, reducing the supply voltage $V_{CC}$ to the field programmable gate array of FIGS. 1 and 2 would result in the net drivers 3–6 being able to sink and source less switching current during normal circuit operation. If the switching current capabilities of the net drivers 3–6 were set for a 5.0 volt $V_{CC}$ operation, then it is likely that the switching current capabilities of net drivers 3–6 would be less than desired for 3.3 volt $V_{CC}$ operation assuming that the antifuses are programmed with the same programming current.

A reliable antifuse field programmable gate array is desired that can operate at high switching speeds at both at a high supply voltage (for example, $V_{CC}$=5.0 volts) as well as at a lower supply voltage (for example, $V_{CC}$=3.3 volts)

SUMMARY

Internal net drivers of a field programmable gate array are laid out with additional transistors to increase current drive capability at low supply voltages when a low supply voltage mask option is used. When a high supply voltage mask option is used, the additional transistors are not used in this way and the net drivers do not provide additional switching current drive capability. In some embodiments, were a low supply voltage mask option net driver operated at the high supply voltage, an impermissibly large switching current would flow through a programmed antifuse in a net coupled to the output of the net driver.

This summary does not purport to define the invention. The invention is defined by the claims.

BRIEF DESCRIPTION OF THE DRAWINGS

FIG. 5 is a layout diagram of the net driver of the embodiment of FIG. 4 fashioned for 5.0 volt $V_{CC}$ operation.

FIG. 7 is a layout diagram of the net driver of the embodiment of FIG. 6 fashioned for 3.3 volt $V_{CC}$ operation.

DETAILED DESCRIPTION OF THE PREFERRED EMBODIMENTS

Figure 1:
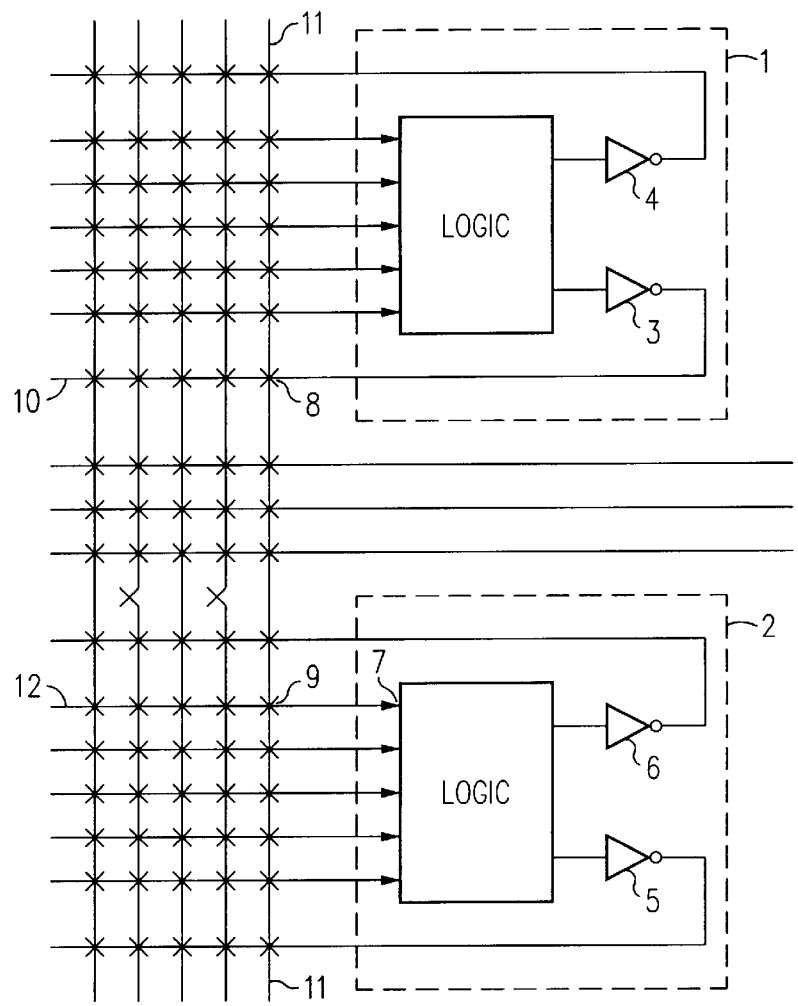
FIG. 1 (Prior Art) is a simplified diagram of two logic modules of a field programmable gate array (FPGA) employing antifuses.
Figure 2:
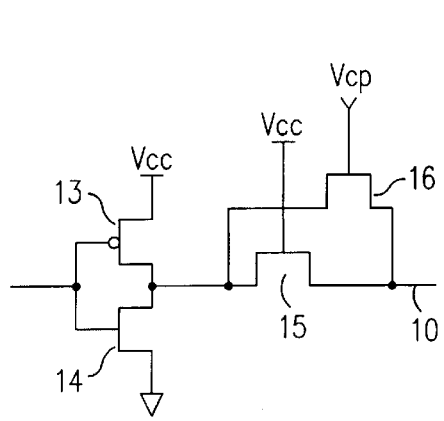
FIG. 2 (Prior Art) is a more detailed diagram of a net driver of FIG. 1.
Figure 3:
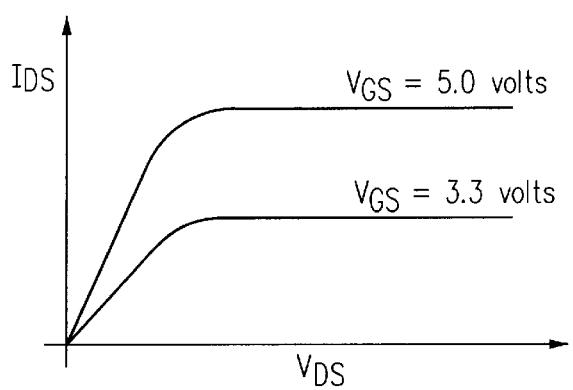
FIG. 3 (Prior Art) is a graph illustrative of the drain-to-source current $I_{DS}$ of a field effect transistor versus drain-to-source voltage $V_{DS}$ for two gate-to-source voltages ($V_{GS}$= 3.3 volts and $V_{GS}$=5.0 volts).
Figure 4:
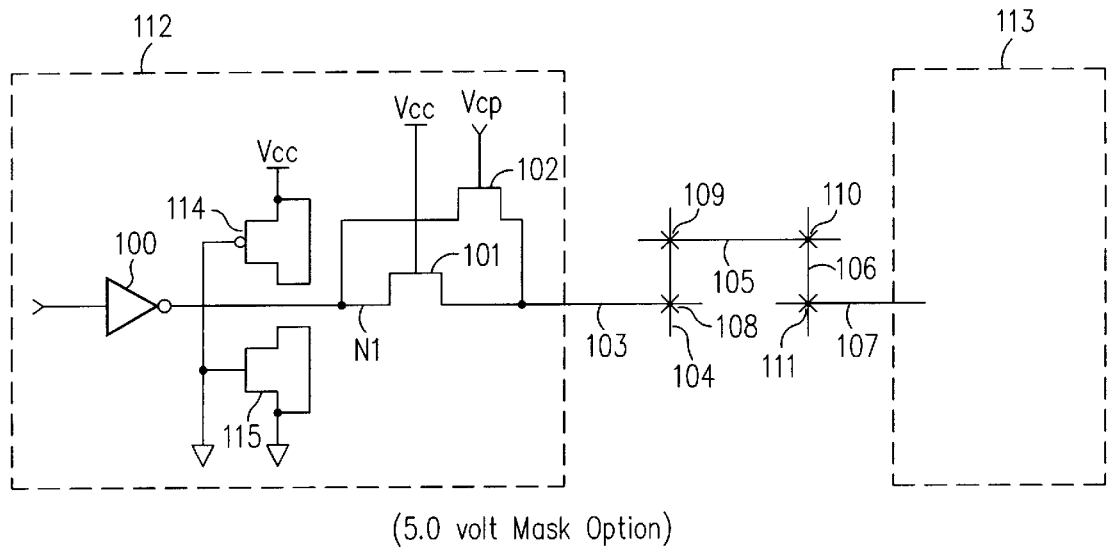
FIG. 4 is a simplified circuit diagram of an embodiment in accordance with the present invention fashioned for 5.0 volt $V_{CC}$ operation.

FIG. 4 is a simplified circuit diagram of an embodiment in accordance with the present invention fashioned for 5.0 volt $V_{CC}$ operation. Inverter 100, relatively large protection transistor 101 and relatively small protection transistor 102 together form an output driver (i.e., net driver). Routing conductors 103–107 and programmed antifuses 108–111 represent a net (i.e., a connection) connecting an output of logic module 112 to an input of logic module 113. It is to be understood that numerous different types of connections via programmed antifuses can be made using the programmable interconnect structure of the field programmable gate array. For additional information on an embodiment of a net driver, a suitable interconnect structure, and a field programmable gate array employing the embodiment of the net driver, see Ser. No. 08/667,702, filed Jun. 21, 1996 (the subject matter of which is incorporated herein by reference).

The gate of protection transistor 101 is coupled to $V_{CC}$ (for example, 5.0 volts) during normal circuit, now U.S. Pat. No. 5,557,136, issued on Sep. 17, 1996, operation and is coupled to ground potential (for example, 0 volts) to isolate the inverter 100 from high programming voltages potentially present in the programmable interconnect structure during antifuse programming. The gate of protection transistor 102 is coupled to a charge pump voltage $V_{CP}$ (for example, 7.8 volts) during normal circuit operation and is coupled to ground potential to isolate the inverter 100 from high programming voltages potentially present in the programmable interconnect structure during antifuse programming. Protection transistors 101 and 102 may, for example, be high voltage (thick gate oxide) transistors sized 73/1.2 and 15/1.2, respectively. If protection transistor 102 were not provided, inverter 100 could only drive a digital logic high of $V_{CC}$ minus one low voltage logic transistor threshold voltage (for example, 0.7 volts) onto horizontal routing conductor 103 due to the gate-to-source threshold voltage (for example, 0.7 volts) loss across transistor 101 whose gate is supplied with $V_{CC}$. Protection transistor 102 (whose gate is supplied with a higher charge pump voltage $V_{CP}$, for example, 7.8 volts) is provided so that inverter 100 can supply the current necessary to drive horizontal conductor 103 from $V_{CC}$ minus the threshold voltage to $V_{CC}$ (no threshold voltage is dropped across transistor 102 due to its gate being supplied with the higher voltage $V_{CP}$). The two protection transistors are provided rather than one large transistor the gate of which is coupled to $V_{CP}$ to: 1) reduce loading on the charge pump thereby reducing the size of the charge pump needed, and 2) to speed connection of logic module outputs to the interconnect structure after power up due to the charge pump coming up to voltage $V_{CP}$ slower than the supply voltage comes up to $V_{CC}$.

Although an inverter 100 is illustrated as the logic element inside the logic module which drives the horizontal routing conductor 103, other logic elements including buffers, gates, latches, flip-flops, and multiplexers can be used depending on the application. The logic element need not be a CMOS logic element but rather may be another suitable type of logic element including a BiCMOS logic element, a TTL logic element, an ECL logic element, and an NMOS logic element. The transistors of the logic element can be field effect transistors or bipolar transistors. Also, protection transistors 101 and 102 need not be provided in all applications. Other circuit configurations are possible.

P-channel transistor 114 and N-channel transistor 115 are also provided. For 5.0 volt $V_{CC}$ operation, however, transistors 114 and 115 are connected so they do not supply switching current onto horizontal routing conductor 103 and do not cause the peak operating current flowing through an antifuse in the net to exceed the antifuse's maximum permissible operating current (in some embodiments, this maximum permissible operating current is approximately 70 percent of the maximum DC programming current used to program the antifuse). In this embodiment, the gates of transistors 114 and 115 are coupled to ground and the drains of transistors 114 and 115 are not coupled to node N1. Rather, the source and drain of each of transistors 114 and 115 are coupled together.

FIG. 5 is a layout diagram of the embodiment of FIG. 4 fashioned for 5.0 volt $V_{CC}$ operation. Reference numeral 200 designates the boundary of an N+ type diffusion region for protection transistors 101 and 102. Reference numeral 201 designates metal of transistors 101 and 102 of a first metal layer contiguous with horizontal conductor 103. Reference numeral 202 designates wide polysilicon strips of the gate of protection transistor 101 and reference numeral 203 designates a wide polysilicon strip of the gate of smaller protection transistor 102. Reference numeral 204 designates metal of the first metal layer of node N1. Reference numeral 205 designates an N+ type diffusion region for the N-channel pulldown transistor of inverter 100 as well as for the N-channel transistor 115. Reference numeral 206 designates the boundary of an N– type well containing the diffusion of the P-channel pullup transistor of inverter 100 as well as for the P-channel transistor 114. Reference numeral 207 designates the boundary of a P+ type diffusion region for the P-channel pullup transistor of inverter 100 as well as for the P-channel transistor 114 within N– well 206. There are no transistors other than the P-channel pullup transistor of inverter 100 and P-channel transistor 114 in well 206. There are no transistors disposed between the pullup transistor of inverter 100 and transistor 114. The entire region outside N– well boundary 206 is a P– well.

Region 208 is a N+ type diffusion region used to connect the N– type well 206 (the bulk node of the P-channel transistors) to supply voltage $V_{CC}$. Reference numeral 209 designates thin polysilicon strips of the gate electrodes of the P-channel pullup and N-channel pulldown transistors of inverter 100. Reference numeral 210 designates thin polysilicon strips of the gate electrodes of the transistors 114 and 115. Metal region 211 and the associated contacts connect the N+ type region 208 to P+ type diffusion 207. Metal strips 212 are coupled to ground and connect to the source region of the N-channel pulldown transistor of inverter 100 via the illustrated contacts. Metal strip 213 and metal 211 are coupled to $V_{CC}$ and connect the source region of the P-channel pullup transistor of inverter 100 via the illustrated contacts.

Metal strip 214 (which is connected to the drain of pullup transistor 114 via the illustrated contacts) is connected to $V_{CC}$ via a special piece 215 of the first metal layer. A $V_{CC}$ supply voltage bus (not shown) extends in the horizontal dimension across the entire area represented by the layout. The lower and upper extents of this $V_{CC}$ bus are represented with the arrows labeled $V_{CC}$. This $V_{CC}$ bus forms a connection in the first metal layer with metal 216, 214 via special piece 215, 213 and 211. It is therefore seen that the source and drain of transistor 114 are coupled to the $V_{CC}$ bus.

Metal strip 217 (which is connected to the drain of pulldown transistor 115 via the illustrated contacts) is connected to ground via a special piece 218 of the first metal layer. A GND ground bus (not shown) extends in the horizontal dimension across the entire area represented by the layout. The upper and lower extents of this GND bus are represented with the arrows labeled GND. This GND bus forms a connection in the first metal layer with metal 219, 217 via special piece 218, and 212. The gate electrodes of the transistors 114 and 115 are connected to ground (a DC voltage) via a special piece 220 of metal and metal strip 219. A second metal layer used for interconnect is not illustrated.

Figure 6:
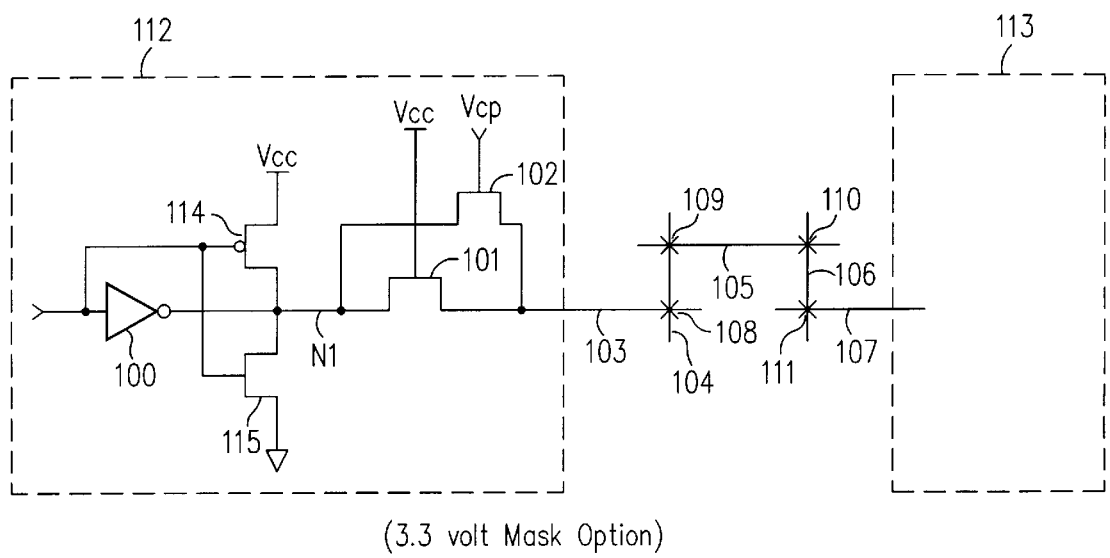
FIG. 6 is a simplified circuit diagram of an embodiment in accordance with the present invention fashioned for 3.3 volt $V_{CC}$ operation.

FIG. 6 is a diagram of a net driver circuit (corresponding to the circuit of FIG. 4) fashioned for 3.3 volt $V_{CC}$ operation. In contrast to the diagram of FIG. 4, P-channel transistor 114 is coupled in parallel with the P-channel pullup transistor of inverter 100 and the N-channel transistor 115 is coupled in parallel with the N-channel pulldown transistor of inverter 100. The net driver circuit of FIG. 6 is therefore able to sink and source more switching current onto horizontal routing conductor 103 for $V_{CC}$ operation at 3.3 volts than it would were transistors 114 and 115 connected as shown in FIG. 4.

FIG. 7 is a layout diagram of the embodiment of FIG. 6 fashioned for 3.3 volt $V_{CC}$ operation. Rather than the first metal layer including the special metal portions 215, 218 and 220 of the layout of FIG. 5, special metal portions 221, 222 and 223 are provided. The gate electrodes 209 and 210 are therefore connected and the drain metal strips 214 and 217 are connected to the metal of node N1 (metal 204). The transistors 114 and 115 are therefore laid out so that a first mask option of the first metal layer can be used to realize the circuit of FIG. 4 and so that a second mask option of the first metal layer can be used to realize the circuit of FIG. 6, the other layers of the field programmable gate array being identical for both mask option devices. In some embodiments, were the net driver of the lower $V_{CC}$ supply voltage mask option operated at the higher $V_{CC}$ voltage, a switching current greater than the maximum permissible operating current would flow through at least one of the programmed antifuses of the field programmable gate array.

In some embodiments, connections made by the mask option metal in FIGS. 5 and 7 (for example, metal 220, 215, 218, 223, 222 and 221) are programmable connections made using antifuses. One antifuse may be programmed to make a connection for 5.0 volt operation whereas another antifuse may be programmed to make a connection for 3.3 volt operation. Such antifuses may be provided with associated programming transistors and appropriate testing transistors (for example, in accordance with the teachings in U.S. patent application Ser. No. 08/667,702 with respect to programming and testing transistors).

Although the present invention is described in connection with certain specific embodiments for instructional purposes, the present invention is not limited thereto. P tub, N tub or twin tub processes can be used. The terms vertical and horizontal are relative to one another and are otherwise not limiting. The two supply voltages of 3.3 volts and 5.0 volts are merely illustrative and the net driver can be adapted for other supply voltages. The invention is applicable to other types of interconnect other than amorphous silicon antifuse interconnect structures. Accordingly, various modifications, adaptations, and combinations of various features of the described embodiments can be practiced without departing from the scope of the invention as set forth in the claims.

What is claimed is:

1. A programmable device, comprising:
  a logic module comprising:
    an internal net driver having a first transistor and a second transistor, the first transistor having a source and drain of a first conductivity type, the second transistor having a source and a drain of a second conductivity type opposite the first conductivity type, the drain of the first transistor being coupled to the drain of the second transistor, the source and drain of the first transistor being disposed in a well, the source of the first transistor being coupled to a first supply voltage Vcc1, the source and drain of the second transistor not being disposed in the well;
    a third transistor having a source and a drain of the first conductivity type, a gate electrode of the third transistor being coupled within the logic module to a DC voltage, the gate electrode of the third transistor not being coupled to gate electrode of the first transistor, the gate electrode of the third transistor not being coupled to a gate electrode of the second transistor, the source and drain of the third transistor being disposed in the well, the source of the third transistor being coupled to the first supply voltage Vcc1; and
    a fourth transistor having a source and a drain of the second conductivity type, a gate electrode of the fourth transistor being coupled within the logic module to a second DC voltage, the gate electrode of the fourth transistor not being coupled to the gate electrode of the first transistor, the gate electrode of the fourth transistor not being coupled to the gate electrode of the second transistor, the source and drain of the fourth transistor not being disposed in the well;
  wherein the source of the first transistor and the third transistor are not coupled to an optional second supply voltage Vcc2, the first supply voltage Vcc1 being greater than the second supply voltage Vcc2;
  a first routing conductor coupled to the drain of the first transistor and to the drain of the second transistor;
  a second routing conductor; and
  an antifuse for coupling the first routing conductor to the second routing conductor, the first routing conductor, the second routing conductor and the antifuse being part of a programmable interconnect structure of the programmable device.

2. The programmable device of claim 1, wherein the first conductivity type is P-type semiconductor, and wherein the well is of N-type semiconductor.

3. The programmable device of claim 1, wherein the first conductivity type is N-type semiconductor, and wherein the well is of P-type semiconductor.

4. The programmable device of claim 1, wherein the internal net driver is a three-statable output driver, the drains of the first and second transistors being coupled to the first routing conductor via a protection transistor, a first electrode of the protection transistor being coupled to the drain of the first transistor and to the drain of the second transistor, a second electrode of the protection transistor being coupled to the first routing conductor.

5. The programmable device of claim 1, wherein the internal net driver is a three-statable output driver, the drains of the first and second transistors being coupled to the first routing conductor via a first protection transistor and a second protection transistor, a first electrode of the first protection transistor being coupled to the drain of the first transistor and to the drain of the second transistor, a second electrode of the first protection transistor being coupled to the first routing conductor, a first electrode of the second protection transistor being coupled to the drain of the first transistor and to the drain of the second transistor, a second electrode of the second protection transistor being coupled to the first routing conductor.

6. The programmable device of claim 1, wherein the drain of the third transistor is not coupled to the drain of the first transistor, and wherein the drain of the fourth transistor is not coupled to the drain of the second transistor.

7. The programmable device of claim 1, wherein there are no transistors disposed between the first and third transistors, and wherein there are no transistors disposed between the second and third transistors.

8. The programmable device of claim 7, wherein the gate electrode of the first transistor extends parallel to the gate electrode of the third transistor.

9. The programmable device of claim 1, wherein the drain of the third transistor is coupled to the source of the third transistor, and wherein the drain of the fourth transistor is coupled to the source of the fourth transistor.

10. The programmable device of claim 1, wherein the antifuse is a programmed antifuse.

11. The programmable device of claim 1, wherein the antifuse is a programmed antifuse which has a maximum permissible operating current, a peak operating current flowing through the programmed antifuse during switching of the first routing conductor during normal operation at a first supply voltage Vcc1, the peak operating current flowing through the programmed antifuse being less than the maximum permissible operating current.

12. The programmable device of claim 1, further comprising:
option means for coupling the source of the third transistor to the drain of the third transistor, and for coupling the source of the fourth transistor to the drain of the fourth transistor.

13. The programmable device of claim 12, wherein the option means is also for coupling the gate electrode of the third transistor and the gate electrode of the fourth transistor to ground potential, the DC voltage and the second DC voltage being ground potential.

14. The programmable device of claim 12, wherein had the third transistor been coupled in parallel with the first transistor and had the fourth transistor been coupled in parallel with the second transistor, a peak operating current flowing through the programmed antifuse during switching of the first routing conductor during normal operation at a second supply voltage Vcc2 would not be greater than the maximum permissible operating current, the first supply voltage Vcc1 being greater than the second supply voltage Vcc2.

15. The programmable device of claim 14, wherein the first supply voltage Vcc1 is about 5 volts and the second supply voltage Vcc2 is about 3 volts.

16. A programmable device, comprising:
a logic module comprising:
an output driver having a first transistor and a second transistor, the first transistor having a source and drain of a first conductivity type, the second transistor having a source and drain of a second conductivity type opposite the first conductivity type, the drain of the first transistor being coupled to the drain of the second transistor, the source and drain of the first transistor being disposed in a well, the source and drain of the second transistor not being disposed in the well;
a third transistor having a source and a drain of the first conductivity type, a gate electrode of the third transistor being coupled within the logic module to a DC voltage, the gate electrode of the third transistor not being coupled to gate electrode of the first transistor, the gate electrode of the third transistor not being coupled to a gate electrode of the second transistor, the source and drain of the third transistor being disposed in the well; and
a fourth transistor having a source and a drain of the second conductivity type, a gate electrode of the fourth transistor being coupled within the logic module to a second DC voltage, the gate electrode of the fourth transistor not being coupled to the gate electrode of the first transistor, the gate electrode of the fourth transistor not being coupled to the gate electrode of the second transistor, the source and drain of the fourth transistor not being disposed in the well;
a first routine conductor coupled to the drain of the first transistor and to the drain of the second transistor;
a second routing conductor; and
an antifuse for coupling the first routing conductor to the second routing conductor, the antifuse being a programmed antifuse which has a maximum permissible operating current, a peak operating current flowing through the programmed antifuse during switching of the first routing conductor during normal operation at a first supply voltage Vcc1, the peak operating current flowing through the programmed antifuse being less than the maximum permissible operating current,
wherein had the third transistor been coupled in parallel with the first transistor and had the fourth transistor been coupled in parallel with the second transistor, a peak operating current flowing through the programmed antifuse during switching of the first routing conductor during normal operation at the first supply voltage Vcc1 would be greater than the maximum permissible operating current.

17. The programmable device of claim 16, wherein the first supply voltage Vcc1 is about 5 volts.

18. The programmable device of claim 16, wherein the DC voltage and the second DC voltage are the same DC voltage.

19. A field programmable gate array, comprising:
a programmable interconnect structure comprising routing conductors and antifuses, the antifuses having a maximum permissible operating current; and means for driving a net in the programmable interconnect structure at a first supply voltage Vcc1 using a first transistor and second transistor coupled in parallel so that the peak operating current flowing through the antifuses is less than the maximum permissible operating current if a first mask option is used, and for driving the net at a second supply voltage Vcc2 with the first transistor and without the second transistor so that the peak operating current flowing through the antifuses is less than the maximum permissible operating current if a second mask option is used, wherein the first supply voltage Vcc1 is less than the second supply voltage Vcc2.

20. The field programmable gate array of claim 19, wherein current flows from source to drain through the first transistor and from source to drain through the second transistor when the first mask option is used, and wherein current flows from source to drain through the first transistor but not from source to drain through the second transistor when the second mask option is used.

21. The field programmable gate array of claim 19, the field programmable gate array having a first logic module and a second logic module, the means being located in the first logic module, the net extending from the means of the first logic module and to an input of the second logic module, the net comprising routing conductors and an antifuse.

22. The field programmable gate array of claim 21, wherein the antifuse is an amorphous silicon antifuse.

23. A method, comprising:
    using a first mask option to provide an effective pulldown transistor size A of a net driver in a first field programmable gate array structure having antifuses;
    using a second mask option to provide an effective pulldown transistor size B of a net driver in a second field programmable gate array structure having antifuses;
    operating the first field programmable gate array structure at a first supply voltage Vcc1; and
    operating the second field programmable gate array structure at a second supply voltage Vcc2, Vcc1 being greater than Vcc2, effective transistor size A being smaller than effective transistor size B, the net driver in the first field programmable gate array structure being substantially identical to the net driver in the second field programmable gate array structure but for differences in a single interconnect layer.

24. The method of claim 23, wherein the single interconnect layer is a metal layer.

25. The method of claim 23, wherein the net driver of the first field programmable gate array outputs a first operating current during the operating at supply voltage Vcc1, and wherein the net driver of the second field programmable gate array outputs a second operating current during the operating at supply voltage Vcc2, the first and second operating currents being substantially equal.

26. A method, comprising:
    using a first mask option to provide an effective pullup transistor size A of a net driver in a first field programmable gate array structure having antifuses;
    using a second mask option to provide an effective pullup transistor size B of a net driver in a second field programmable gate array structure having antifuses;
    operating the first field programmable gate array structure at a first supply voltage Vcc1; and
    operating the second field programmable gate array structure at a second supply voltage Vcc2, Vcc1 being greater than Vcc2, effective transistor size A being smaller than effective transistor size B, the net driver in the first field programmable gate array structure being substantially identical to the net driver in the second field programmable gate array structure but for differences in a single interconnect layer.

27. The method of claim 26, wherein the single interconnect layer is a metal layer.

28. The method of claim 26, wherein the net driver of the first field programmable gate array outputs a first operating current during the operating at supply voltage Vcc1, and wherein the net driver of the second field programmable gate array outputs a second operating current during the operating at supply voltage Vcc2, the first and second operating currents being substantially equal.

* * * * *